United States Patent [19]

Nomiya et al.

[11] 4,068,148

[45] Jan. 10, 1978

[54] CONSTANT CURRENT DRIVING CIRCUIT

[75] Inventors: Kosei Nomiya, Tokyo; Takao Tsuiki, Kokubunji, both of Japan

[73] Assignee: Hitachi, Ltd., Japan

[21] Appl. No.: 621,841

[22] Filed: Oct. 14, 1975

[51] Int. Cl.[2] .................. H05B 43/00

[52] U.S. Cl. .................. 315/169 R; 307/33; 307/60; 307/297; 307/304; 315/307; 323/4; 340/336

[58] Field of Search .................. 315/291, 292, 294, 297, 315/301, 169, 169 R; 340/366 B, 378 R, 336; 307/31, 33, 34, 60, 52, 296, 297, 304; 323/4, 22 R

[56] References Cited

U.S. PATENT DOCUMENTS

| | | | |
|---|---|---|---|
| 2,876,387 | 3/1959 | Doleman | 315/291 |
| 2,936,404 | 5/1960 | Simone | 315/291 |
| 3,519,839 | 7/1970 | Nehez | 315/297 |
| 3,573,811 | 4/1971 | Knecht | 340/378 R |
| 3,796,951 | 3/1974 | Joseph | 340/378 |
| 3,875,430 | 4/1975 | Prak | 307/304 X |
| 3,878,406 | 4/1975 | Beneking | 307/304 |
| 3,902,806 | 9/1975 | Boper | 307/297 X |
| 4,020,367 | 4/1977 | Yamashiro et al. | 307/297 |

*Primary Examiner*—Eugene R. LaRoche
*Attorney, Agent, or Firm*—Craig & Antonelli

[57] ABSTRACT

A constant current driving circuit for driving light emitting diodes, wherein a variation detecting circuit comprising a resistor and a field effect transistor is provided and the output voltage of the detecting circuit is effectively used to control the variation of electric current which flows through the driving transistor.

16 Claims, 3 Drawing Figures

CONSTANT CURRENT DRIVING CIRCUIT

FIELD OF THE INVENTION

The present invention relates to a constant current driving circuit, principally, a constant current driving circuit for driving light emitting diodes which comprises insulated gate type field effect transistors (hereinafter referred to as FETs).

BACKGROUND OF THE INVENTION

Generally, light emitting diodes should be driven by a constant current in order to decrease variations or deviations in the intensity of the output of the diodes. There is a known driving circuit comprising a plurality of resistors each connected in series with an integrated driving FET and a light emitting diode and having resistance which is much larger than the resistance during the conducting state of the light emitting diode. According to this circuit, the value of current flowing through the light emitting diode is substantially determined by the above-mentioned series resistor and variations or deviations in current caused by resistance variations or deviations of the driving FETS and light emitting diodes are suppressed, whereby a substantially constant current operation can be obtained.

However, the foregoing driving circuits have some problems as follows.

1. Since a plurality of resistors corresponding in number to the number of light emitting diodes are connected outside the IC device, the number of circuit parts forming an electronic circuit system is increasing the cost due to an increase in the number of assembly steps.

2. The resistors dissipate a large amount of uneffective current and voltage. This causes a problem especially for a pocket calculator which is powered by a battery.

BRIEF SUMMARY OF THE INVENTION

The present invention has been developed to solve the foregoing problems and one of its objects is to provide an improved constant current driving circuit comprising the FETs without the need for a plurality of resistors for limiting current-flow.

BRIEF DESCRIPTION OF THE INVENTION

According to the present invention a constant current driving circuit comprises FETs wherein a first FET and a resistor are connected in series between a reference potential terminal and a voltage source terminal, the gate electrode of the first FET is connected to a terminal of a fixed bias potential, the gate electrode of a second FET connected in series to the driving transistor is controlled by the voltage potential level at the junction point between the first FET and the resistor.

According to another feature of the present invention, a constant current driving circuit comprises FETs wherein, between a reference potential terminal and a voltage source terminal, an FET and a resistor are connected in series, the gate electrode of the FET is connected to a fixed bias potential, and an input signal level controlling a driving transistor is controlled by the voltage potential level at the junction point in the foregoing series connection.

DETAILED DESCRIPTION

Figure 1:
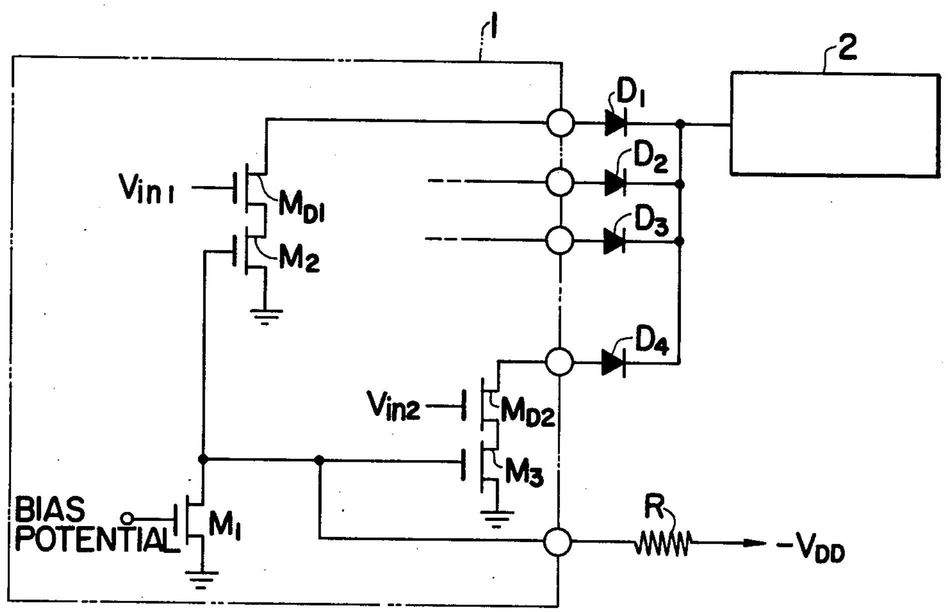
FIG. 1 shows an example of a circuit for driving light emitting diodes according to the present invention.

In FIG. 1, a plurality of MISFETs M2 (M3) for limiting current flow are respectively connected between the source electrodes of driving MISFETs MD1 (MD2) and a reference potential terminal. A MISFET M1 and a resistor R are connected in series and form a detector circuit for detecting the variation or deviation in electric characteristics. The gate electrodes of the current limiting MISFETs M2 (M3) are commonly connected to the junction point between M1 and R, whereby MISFETs M2 (M3) are commonly controlled by the voltage potential level at the junction point. MISFETs MD1 (MD2), M1, M2 and M3 shown in an area surrounded by broken line 1 are fabricated in a single semiconductor body, such as a monocrystalline silicon body, by using integrated circuit technology.

Although, in FIG. 1, the driving circuits for driving light emitting diodes D1 and D4 are shown, the driving circuits for driving the other diodes D2, D3 are constructed in the same manner. In case of driving other segments, current limiting FETs are commonly controlled. Thus, only one resistor R is outwardly connected in the IC. In the drawing, the numeral 2 indicates a so-called digit selecting circuit.

According to the present invention, the above-mentioned objects can be obtained as follows.

Since the driving FETs MD1 (MD2), the current limiting FETs M2 (M3), and the detecting FET M1 are fabricated into a common semiconductor integrated circuit device, all of the FETs have substantially the same characteristic variations or deviations. For example, where driving FETs MD1 (MD2) provide an electric current larger than a predetermined value, the detecting FET M1 will also provide an increased electric current which causes an increased voltage drop in the outwardly connected resistor R and causes a detecting voltage potential at a relatively low level at the junction point. Therefore, the current limiting FETs M2 (M3), controlled by the resulted detecting voltage potential, operate so as to decrease the driving current flowing through light emitting diodes D1 to D4. On the other hand, where driving FETs provide an electric current smaller than a predetermined value, the FETs M2 (M3), for limiting current-flow, operate so as to increase the driving current to light emitting diodes D1 to D4, since the detected potential level increases.

The foregoing circuit of the present invention can also be employed to suppress any adverse effect due to characteristic variations or deviations of FETs due to the ambient temperature. Furthermore, it has this advantage with respect to variations of output of the voltage source, if the fixed bias potential applied to the gate electrode of the detecting FET M1 is the voltage source potential.

As mentioned above, the electric current flowing through the driving circuit is substantially constant. Since the electric circuit system can be reconstructed by using only one outwardly connected resistor R, a decrease in cost due to a decrease in the number of circuit elements can be expected and the foregoing ineffective current and voltage dissipated by resistors can be decreased. It should be noted that the driving current can be controlled to a predetermined value by changing the resistance value of the outwardly connected resistor R.

It is desirable for the outwardly connected resistor R to have a relatively high constant resistance value, for example, more than 10kΩ or a high value having a linear characteristic, and to have a resistance-temperature coefficient smaller than that of the FETs.

The present invention is not limited to the foregoing embodiment, but is applicable in other various modifications.

Figure 2:
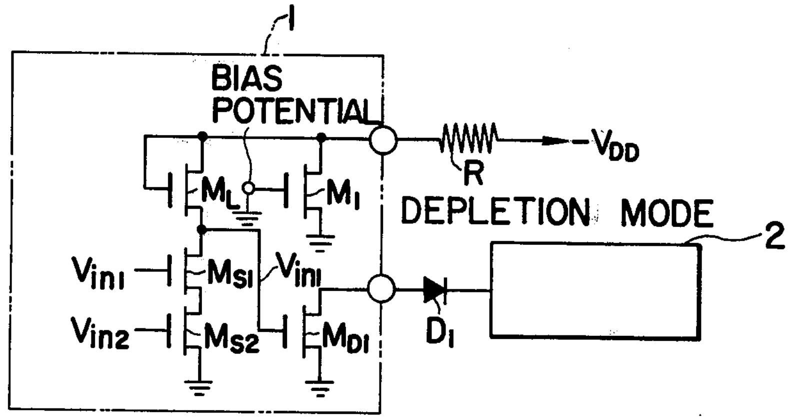
FIG. 2 shows another example of a driving circuit according to the present invention.
Figure 3:
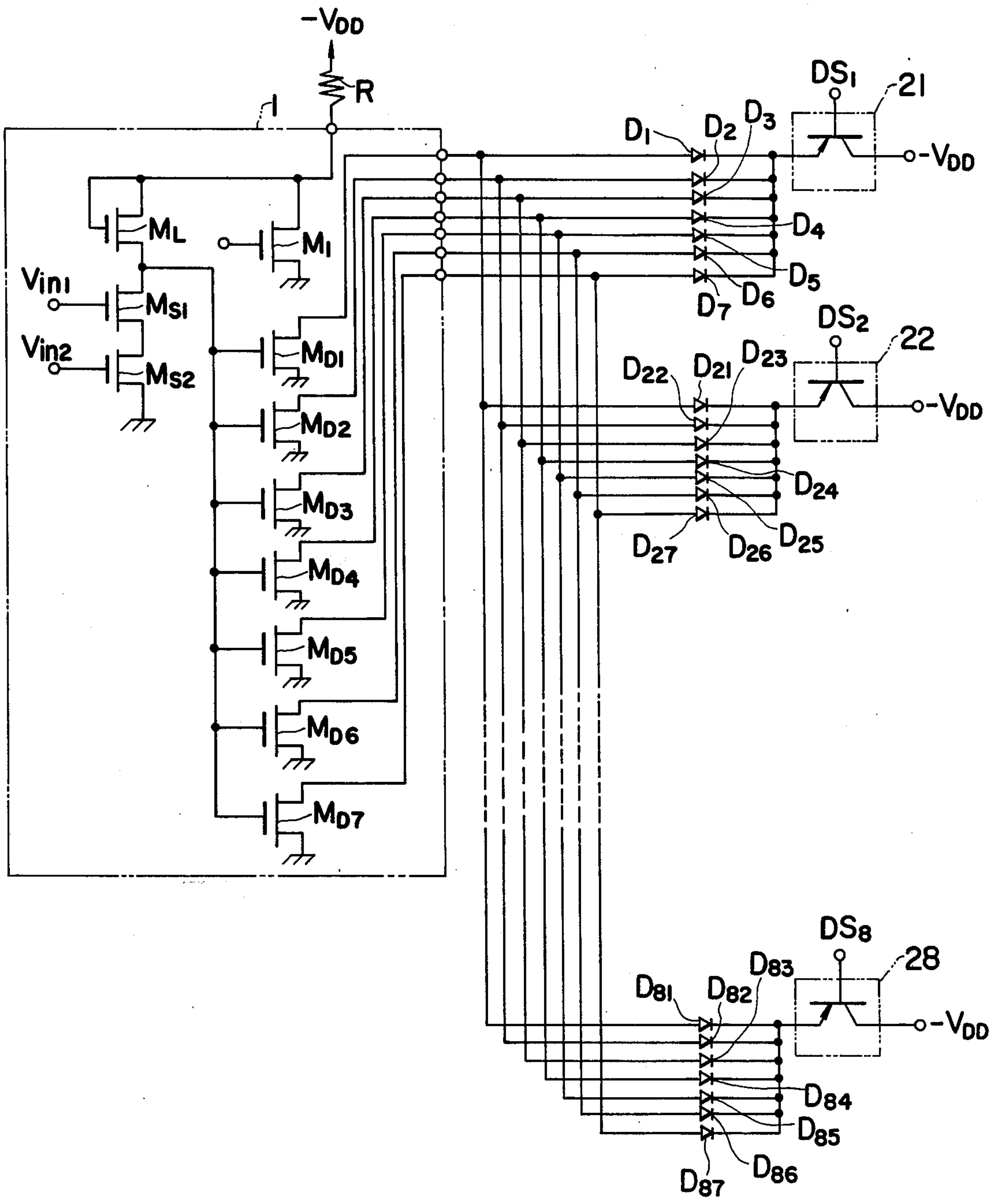
FIG. 3 shows a dynamic driving system for driving light emitting diodes forming an eight digit indicator according to an embodiment of the present invention.

For example, as is shown in FIG. 2 and FIG. 3, the output voltage level detected by the outwardly connected resistor R an FET M1 for detecting any variation may be used to control the input signal level of driving FETs MD1, wherein the detected voltage potential is used as a voltage source for a logic circuit comprising FETs ML, MS1, and MS2 which controls the driving FET MD1. In this embodiment, if a current larger than a predetermined value flows, the input signal level of the driving FET MD1 decreases in the same way as mentioned in the first embodiment and it operates so as to suppress an increase of the driving current. In this case it might be understood that the driving FET MD1 could operate also as the current limiting FET M2 (M3) in the first embodiment. In this case, it is not necessary to provide another special current limiting FET and the number of circuit elements can be decreased.

Furthermore, it should be understood that the variation or deviation detecting FET M1 may be constructed by either a depletion mode FET or an enhancement mode FET and the fixed bias potential may be selected to be that of the voltage source, the reference potential or the middle potential thereof according to type of detecting FET. For example, when the detecting FET M1 is a depletion mode FET, the gate electrode of FET M1 may be connected to the reference potential terminal, as shown by the dotted line connection in FIG. 2.

FIG. 3 shows a dynamic driving system for driving light emitting diodes forming an eight digit display, wherein each display digit comprises seven diode segments and they are activated by digit signals DS1 to DS8 through digit selecting circuits 21 to 28. The driving circuit comprising the FETs surrounded by broken line 1 is fabricated in a single silicon body and has substantially the same circuit structure as FIG. 2.

The present invention is applicable not only to the driving circuit for light emitting diodes, but also to constant current driving circuits.

What we claim is:

1. A constant current driving circuit comprising:
a first series connection of a first field effect transistor and a resistor connected between a reference potential terminal and a voltage source terminal;
means for supplying a fixed bias potential to the gate electrode of said first field effect transistor;
a second series connection of a driving field effect transistor and a second field effect transistor; and
means for controlling the second field effect transistor by the voltage level appearing at the connection point between said first field effect transistor and said resistor.

2. A constant current driving circuit comprising:
a driving transistor;
a series connection of a first field effect transistor and a resistor connected between a reference potential terminal and a voltage source terminal;
the gate electrode of said first field effect transistor being supplied with a fixed voltage only; and
means for controlling an input signal level which controls the driving transistor by the voltage level appearing at the connection point between said first field effect transistor and said resistor.

3. A circuit for driving light emitting diodes comprising:
a plurality of light emitting diodes;
a first series connection of a first field effect transistor and a resistor connected between a reference potential terminal and a voltage source terminal;
a plurality of second series connections each having a second field effect transistor and a driving field effect transistor connected in series between the reference potential terminal and the corresponding light emitting diodes;
means for supplying a fixed bias potential to the gate electrode of said first field effect transistor; and
means for commonly connecting the gate electrodes of said second transistors in said second series connections to the connection point between said resistor and said first field effect transistor.

4. A constant current driving circuit comprising:
at least one input terminal to which an input voltage is applied;
at least one output terminal;
a first field effect transistor and a resistor connected in series between first and second sources of respectively different reference potentials, the gate electrode of said first field effect transistor being supplied with a fixed bias potential;
at least one series connection of a driving field effect transistor and a current limiting field effect transistor connected between the junction between said first field effect transistor and said resistor and said at least one output terminal, said at least one input terminal being connected to the gate electrode of the driving field effect transistor of said at least one series connection.

5. A constant current driving circuit according to claim 4, wherein the junction between said first field effect transistor and said resistor is connected to the gate electrode of said current limiting field effect transistor.

6. A constant current driving circuit according to claim 5, wherein said at least one series connection is connected between a respective output terminal and said first source of reference potential.

7. A constant current driving circuit comprising:
a logic circuit comprising at least one field effect transitor having an input terminal to which a respective logic input voltage level is applied and a load connected thereto;
at least one output terminal;
at least one driving field effect transistor connected between said logic circuit and said at least one output terminal;
a detecting field effect transistor in series with a resistor between first and second sources of respectively different reference potentials, the gate electrode of said detecting field effect transistor being supplied with a fixed bias potential; and
said load of said logic circuit being connected to the connection between said detecting field effect transistor and said resistor.

8. A constant current driving circuit according to claim 7, wherein said logic circuit and said at least one driving field effect transistor are connected to said first source of reference potential.

9. A constant current driving circuit according to claim 7, wherein the gate electrode of said at least one driving field effect transistor is connected to said logic circuit.

10. A constant current driving circuit according to claim 9, wherein said at least one output terminal and said at least one driving field effect transistor comprise a plurality of output terminals and a plurality of field effect transistors.

11. A constant current driving circuit according to claim 10, further comprising a plurality of light emitting diodes respectively connected to said plurality of output terminals.

12. A constant current driving circuit according to claim 11, further comprising a plurality of controllable switching circuits connected between said plurality of light emitting diodes and said second source of reference potential.

13. A circuit for driving at least one light emitting diode comprising:

a first field effect transistor, to the gate electrode of which a fixed bias voltage only is applied;

a resistor connected in series with said first field effect transistor between first and second sources of respectively different reference potentials; and first means for controlling the value of the driving current of said light emitting diode in response to the voltage drop across said resistor.

14. A circuit according to claim 13, further comprising second means for logically controlling the driving current of said light emitting diode by at least one input signal.

15. A circuit according to claim 13, further comprising a plurality of light emitting diodes, the value of the driving current of each of said diodes being uniformly controlled in response to the voltage drop across said resistor.

16. A circuit according to claim 13, wherein said first field effect transistor is a depletion mode transistor and its gate electrode is coupled to the source electrode thereof.

* * * * *